(12) United States Patent
Alrod et al.

(10) Patent No.: US 9,633,749 B2
(45) Date of Patent: Apr. 25, 2017

(54) SYSTEM AND METHOD OF MANAGING TAGS ASSOCIATED WITH READ VOLTAGES

(71) Applicant: SANDISK TECHNOLOGIES INC., Plano, TX (US)

(72) Inventors: Idan Alrod, Herzliya (IL); Eran Sharon, Rishon Lezion (IL); Evgeny Mekhanik, Rehovot (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 218 days.

(21) Appl. No.: 14/134,194

(22) Filed: Dec. 19, 2013

(65) Prior Publication Data

US 2015/0179284 A1    Jun. 25, 2015

(51) Int. Cl.
| | |
|---|---|
| *G06F 12/00* | (2006.01) |
| *G06F 13/00* | (2006.01) |
| *G11C 29/50* | (2006.01) |
| *G06F 11/07* | (2006.01) |
| *G06F 11/10* | (2006.01) |
| *G06F 12/02* | (2006.01) |
| *G06F 12/121* | (2016.01) |
| *G11C 11/56* | (2006.01) |
| *G11C 16/26* | (2006.01) |

(52) U.S. Cl.
CPC ...... *G11C 29/50004* (2013.01); *G06F 11/076* (2013.01); *G06F 11/1016* (2013.01); *G06F 11/1044* (2013.01); *G06F 11/1072* (2013.01); *G06F 12/0246* (2013.01); *G06F 12/121* (2013.01); *G11C 11/5642* (2013.01); *G11C 16/26* (2013.01); *G06F 2212/69* (2013.01); *G06F 2212/7209* (2013.01); *G11C 2029/5004* (2013.01)

(58) Field of Classification Search
USPC .......................................................... 711/103
See application file for complete search history.

(56) References Cited

U.S. PATENT DOCUMENTS

| | | | |
|---|---|---|---|
| 8,315,092 | B2 | 11/2012 | Strasser et al. |
| 8,422,307 | B2 | 4/2013 | Yoo et al. |
| (Continued) | | | |

FOREIGN PATENT DOCUMENTS

| | | |
|---|---|---|
| WO | 2008057822 A2 | 5/2008 |

OTHER PUBLICATIONS

Invitation to Pay Additional Fees and, Where Applicable, Protest Fee for International Application No. PCT/US2014/069236, issued Apr. 10, 2015, 6 pages.

(Continued)

*Primary Examiner* — Sean D Rossiter
(74) *Attorney, Agent, or Firm* — Toler Law Group, PC

(57) ABSTRACT

A data storage device includes a controller coupled to a non-volatile memory. The non-volatile memory is configured to store multiple tags that include a first tag and a second tag. The controller is configured to determine one or more candidate values associated with a candidate tag. The one or more candidate values may be determined based on an operation applied to the first tag and the second tag. The controller is further be configured to cause the non-volatile memory to remove the first tag or the second tag from the multiple tags.

21 Claims, 6 Drawing Sheets

(56) References Cited

U.S. PATENT DOCUMENTS

| | | | |
|---|---|---|---|
| 2006/0175420 A1* | 8/2006 | Satou | G06K 19/0701 |
| | | | 235/492 |
| 2008/0025099 A1 | 1/2008 | Li et al. | |
| 2009/0125671 A1 | 5/2009 | Flynn et al. | |
| 2010/0296350 A1* | 11/2010 | Kim | G11C 11/5642 |
| | | | 365/189.15 |
| 2011/0066788 A1 | 3/2011 | Eleftheriou et al. | |
| 2011/0125959 A1* | 5/2011 | Yeung | G11C 11/5635 |
| | | | 711/103 |
| 2013/0019051 A1 | 1/2013 | Somanache et al. | |
| 2013/0117613 A1* | 5/2013 | Tai | G06F 11/1048 |
| | | | 714/54 |
| 2013/0238836 A1* | 9/2013 | Suzuki | G11C 16/3431 |
| | | | 711/103 |
| 2015/0339057 A1* | 11/2015 | Choi | G06F 3/061 |
| | | | 711/103 |
| 2015/0370493 A1* | 12/2015 | Choi | G06F 3/0619 |
| | | | 711/103 |
| 2016/0018998 A1* | 1/2016 | Mohan | G06F 3/0659 |
| | | | 711/103 |
| 2016/0292094 A1* | 10/2016 | Jeter | G06F 13/1668 |

OTHER PUBLICATIONS

International Search Report and Written Opinon of the International Searching Authority for International Application No. PCT/US2014/069236 mailed Jun. 12, 2015, 16 pages.

International Preliminary Report on Patentability for International Application No. PCT/US2014/069236 mailed Jun. 30, 2016, 12 pages.

* cited by examiner

202

| TAG | BLOCKS | READ VOLTAGE |
|---|---|---|
| $t_1$ | 1-10 | 1.0 |
| $t_2$ | 11-15 | 1.1 |
| $t_3$ | 16-40 | 1.3 |
| ⋮ | ⋮ | ⋮ |
| $t_n$ | x-y | z |

208

| TAG | BLOCKS | READ VOLTAGE |
|---|---|---|
| $t_1$ | 1-15 | 1.05 |
| - | - | - |
| $t_3$ | 16-40 | 1.3 |
| ⋮ | ⋮ | ⋮ |
| $t_n$ | x-y | z |

SYSTEM AND METHOD OF MANAGING TAGS ASSOCIATED WITH READ VOLTAGES

FIELD OF THE DISCLOSURE

The present disclosure is generally related to managing tags associated with read voltages.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data. For example, a user may store large audio files, images, videos, and other files at a data storage device.

Read voltages for reading a flash memory of a non-volatile data storage device are not the same for all of the blocks of the flash memory. Due to aging and cycling, the reading voltages tend to change over time, such that a first set of read voltages (e.g., a first tag) for reading a first block which is recently programmed may differ from a second set of read voltages (e.g., a second tag) for a second block which was programmed a long time before the first block. The non-volatile data storage device may store different read voltages that are determined for different blocks. However, a number of sets of read voltages (e.g., a number of tags) that the non-volatile data storage device stores may be a predefined number.

During operation of the non-volatile data storage device, sets of read voltages may be generated (e.g., using a direct cell voltage distribution (CVD) calculation) and stored until the predefined number is reached. After the predetermined number of sets of read voltages is reached, blocks that may be opened are then associated with the last set of read voltages (e.g., corresponding to the "last" block) that was generated. This may result in a situation where a particular set of read voltages is associated with multiple blocks where some of the blocks should be associated with a different set of read voltages.

During a read operation, a particular block which is associated with the last set of read voltages may fail decoding, may have a large bit error rate (BER) value, may require multiple decoding attempts before the particular block is decoded successfully, or may require decoding with multiple soft bits (e.g., two soft bits). Such an event may trigger a direct CVD calculation and, as a result, a "new" set of read voltages for the failing block may be computed and may be saved by replacing (e.g., overwriting) the last set of read voltages. The "new" set of read voltages may be usable for the particular block that failed but other blocks (e.g., "older" blocks) which are associated with the last set of read voltages may still be readable with the last set of read voltages, but may fail or have difficulties with the new set of read voltages. If a read operation is performed on one of the other blocks (e.g., the "older" blocks), a direct CVD calculation may be triggered again, and a "brand new" set of read voltages is computed. The "brand new" set of read voltages may replace the "new" set of read voltages. This process of triggering direct CVD computations and updating the set of read voltages may be repeated multiple times. Each computation of the direct CVD calculation requires resources and causes a delay (e.g., a few milliseconds) which may cause degradation in system performance of the non-volatile data storage device.

SUMMARY

Techniques are disclosed for managing tags associated with read voltages. A data storage device may be configured to manage one or more tags by tracking the one or more tags used to read a plurality of memory blocks of the data storage device. To manage the one or more tags, a controller of the data storage device may be configured to generate, update, and combine tags used by the data storage device.

As the data storage device operates, one or more tags may be generated and stored by the data storage device. Each of the one or more tags may correspond to one or more data blocks. When the number of tags reaches a threshold number, the controller may initiate a consolidation routine to merge (e.g., combine) at least two tags together and make room for more tags to be generated and stored. The controller may identify at least two tags, such as a first tag and a second tag, to be merged from the tags stored by the data storage device. The first tag may include a first set of one or more read voltages and the second tag may include a second set of one or more read voltages. The controller may compute a candidate tag based on an operation applied to the first tag and the second tag. For example, the operation may include one or more arithmetic computations or performance of a function, such as an average function. To illustrate, the candidate tag may include a candidate set of one or more read voltages that is an average of the first set of one or more read voltages and the second set of one or more read voltages. The controller may complete the merge of the first tag and the second tag by storing the candidate tag and removing the first tag and the second tag. The candidate tag may then be used to read data blocks that were previously associated with the first tag and the second tag.

During operation of the data storage device, the controller may determine that a number of errors associated with blocks read using a particular tag is in excess of a threshold number of errors. Based on such a determination, the controller may attempt to update the particular tag. To update the particular tags, the controller may select a group of blocks from all of the blocks that correspond to the particular tag. For each block of the group of blocks, the controller may select a set of one or more corresponding wordlines. The controller may generate multiple groups of read voltages by performing a cell voltage distribution (CVD) calculation of each of the one or more wordlines for each block of the group of blocks. Based on the multiple groups of read voltages, the controller may determine an updated set of read voltages. The controller may test the updated set of read voltages on each of the one or more wordlines for each block of the group of blocks to determine an error value of the updated set of read voltages. If the error value satisfies (e.g., is less than or equal to) an error threshold, the particular tag may be updated with the updated set of read voltages. If the error value does not satisfy the error threshold, the particular tag may be removed.

The controller may be configured to generate one or more tags that each includes a corresponding set of read voltages and a corresponding interval (e.g., voltage range) for each read voltage in the set of read voltages. For a particular tag that includes one or more intervals, a particular interval that corresponds to a particular read voltage may be determined such that each voltage included in the interval may be used to read blocks associated with the particular tag. For example, the interval may be determined so that a bit error rate (BER) estimation for each voltage that is included in the interval may satisfy a threshold value, such that the interval defines a range of acceptable voltage values. When two tags of the data storage device each include corresponding intervals (e.g., ranges), the controller may determine whether there is an intersection between the two corresponding intervals and may merge the two tags based on a determination that the intersection is non-empty (i.e., there is an overlap between the two corresponding intervals).

By merging tags, updating tags, and generating tags that include the data storage device may track and manage multiple tags. The tags may be stored in a small amount of memory while providing reading voltages that may be applied to multiple blocks. The small amount of memory used may be advantageous because as technology shrinks there is a growing need for better and more efficient methods for determining tags and associating tags with one or more blocks. For example, as technology shrinks, variations between blocks becomes larger, and therefore tags determined for one set of blocks (e.g., in one plane of a memory) may not be suitable for reading a different set of blocks (e.g. in an adjacent plane of the memory). The techniques described herein enable a data storage device to manage (e.g., control) tags associated with each block of the memory in a fast and an efficient manner, while keeping a number of the tags within the data storage device's resource budget (e.g., an allocated amount of space to store a plurality of tags).

DETAILED DESCRIPTION

Particular embodiments of the present disclosure are described below with reference to the drawings. In the description, common features are designated by common reference numbers throughout the drawings.

Figure 1:
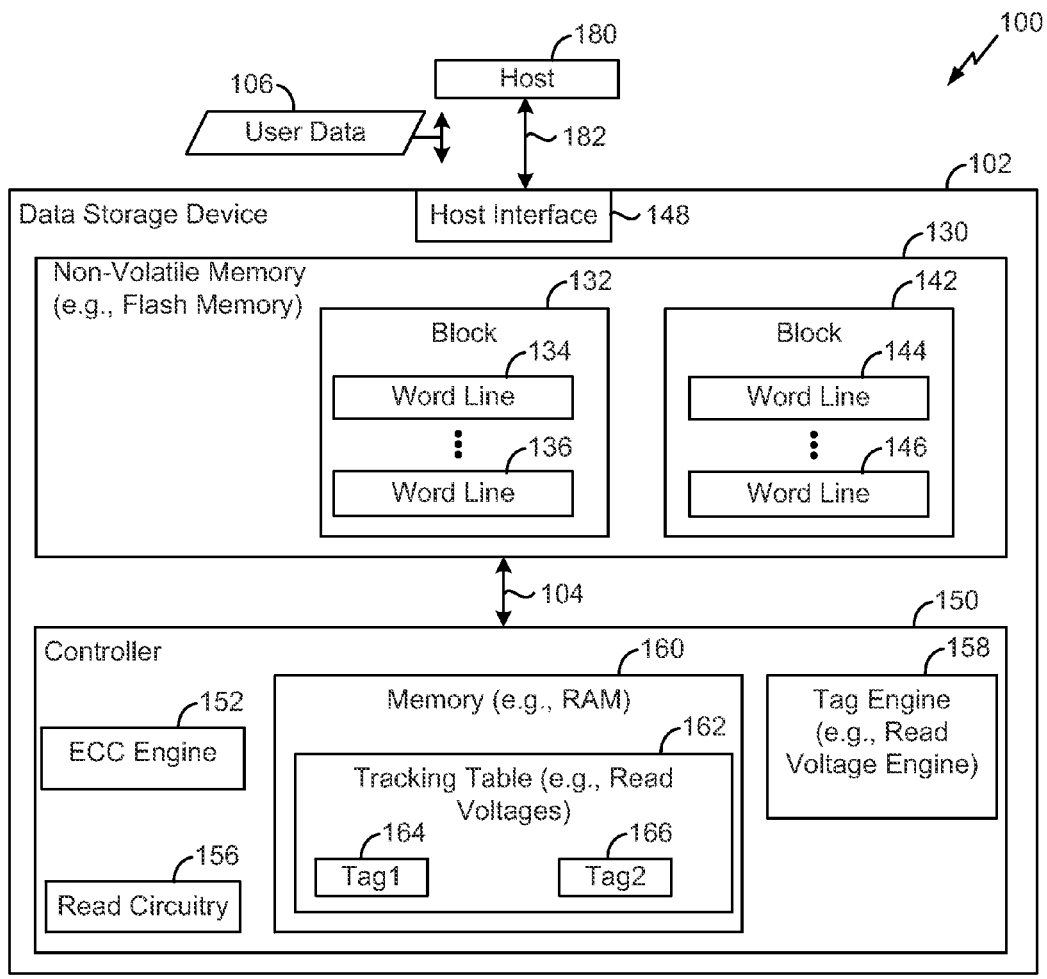
FIG. 1 is a block diagram of a particular illustrative embodiment of a system including a data storage device that manages tags associated with read voltages.
Figure 1:
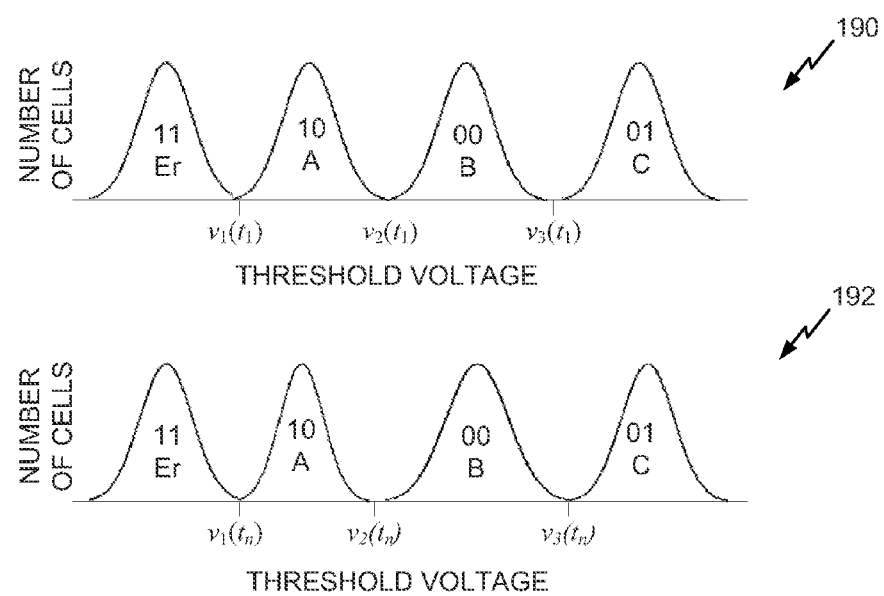

FIG. 1 is a block diagram of a particular illustrative embodiment of an electronic device 100 including a data storage device 102 and a host device 180. The data storage device 102 may be coupled to the host device 180 via a communication path 182, such as a wired communication path and/or a wireless communication path. The data storage device 102 may be embedded within the host device 180, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 180. For example, the data storage device 102 may be removably coupled to the host device 180 in accordance with a removable universal serial bus (USB) configuration.

The host device 180 may issue one or more commands to the data storage device 102, such as one or more requests to read data from or write data to a memory of the data storage device 102. The host device 180 may include a mobile telephone, a music player, a video player, a gaming console, an electronic book reader, a personal digital assistant (PDA), a computer, such as a laptop computer, a notebook computer, or a tablet, any other electronic device, or any combination thereof. The host device 180 may communicate via a host controller, which may enable the host device 180 to read data from and to write data to the data storage device 102. The host device 180 may operate in compliance with a JEDEC Solid State Technology Association industry specification, such as an embedded MultiMedia Card (eMMC) specification or a Universal Flash Storage (UFS) Host Controller Interface specification. The host device 180 may operate in compliance with one or more other specifications, such as a Secure Digital (SD) Host Controller specification as an illustrative example. The host device 180 may communicate with the data storage device 102 in accordance with another suitable communication protocol.

To further illustrate, the data storage device 102 may be configured to be coupled to the host device 180 as embedded memory, such as in connection with an eMMC configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The data storage device 102 includes a controller 150 and a non-volatile memory 130. The controller 150 may be coupled to the non-volatile memory 130 via a bus 104, an interface, another structure, or a combination thereof. The non-volatile memory 130 may include a flash memory (e.g., a NAND flash memory or a NOR flash memory). In other implementations, the non-volatile memory 130 may include an erasable programmable read-only memory (EPROM), an electrically-erasable programmable read-only memory (EEPROM), a read-only memory (ROM), a one-time programmable memory (OTP), another type of memory, or a combination thereof.

The non-volatile memory 130 may include multiple blocks of wordlines (also referred to herein as "physical pages"). In the example of FIG. 1, the non-volatile memory 130 includes a first block 132 and a second block 142. Although the non-volatile memory 130 is illustrated as including two blocks 132, 142, the non-volatile memory 130 may include less than two blocks or more than two blocks. The blocks 132, 142 may each include one or more wordlines. In the example of FIG. 1, the first block 132 includes a first wordline 134 and an $n^{th}$ wordline 136 (e.g., n may be any positive integer greater than one) and the second block 142 includes a second wordline 144 and an m$^{th}$ wordline 146 (e.g., m may be any positive integer greater than or equal to one). Although each of the blocks 132, 142 is illustrated as including two wordlines, each of the blocks 132, 142 may include less than two wordlines or more than two wordlines Additionally, the blocks 132, 142 may include a same number of wordlines or a different number of wordlines. It should be appreciated that FIG. 1 is illustrative and that the data storage device 102 may include a different number and/or configuration of blocks and/or wordlines.

Each of the wordlines 134-136, 144-146 may include one or more storage elements (e.g., one or more flash memory cells). The one or more storage elements may be configured for use as Single-Level Cell (SLC) storage elements and/or as Multi-Level Cell (MLC) storage elements. The SLC storage elements, such as in a binary cache, may store a single bit per storage element. The Multi-Level Cell (MLC) storage elements may store two bits per storage element, three bits per storage element, four bits per storage element, or more than four bits per storage element.

The controller 150 may include a memory 160, an error correcting code (ECC) engine 152, and read circuitry 156. The controller 150 may receive data and commands (e.g., instructions) from the host device 180 and may send data to the host device 180. The controller 150 may send data and commands to the non-volatile memory 130 and may receive data from the non-volatile memory 130. As an illustrative example, the controller 150 may receive user data 106 from the host device 180 via the host interface 148 of the data storage device 102. The controller 150 may store (e.g., buffer) the user data 106 at the memory 160. The user data 106 may correspond to data (e.g., a file or a portion of a file) that is to be stored at the non-volatile memory 130.

The ECC engine 152 may be configured to receive the user data 106 and to generate a codeword based on the user data 106. For example, the ECC engine 152 may include an encoder configured to encode the user data 106 using an ECC encoding technique. The ECC engine 152 may include a Reed-Solomon encoder, a Bose-Chaudhuri-Hocquenghem (BCH) encoder, a low-density parity check (LDPC) encoder, a turbo encoder, an encoder configured to encode the user data 106 according to one or more other ECC techniques, or a combination thereof. The ECC engine 152 may include a decoder configured to decode data read from the non-volatile memory 130 to detect and correct, up to an error correction capability of an ECC technique used by the ECC engine 152, bit errors that may be present in the data. A number of errors identified by the ECC engine 152 may be tracked by the controller 150, such as by the ECC engine 152. For example, based on the number of errors, the ECC engine 152 may determine a bit error rate (BER) associated with one or more blocks of the non-volatile memory. Additionally or alternatively, the ECC engine 152 (or the controller 150) may be configured to calculate a BER estimation of one or more blocks based on a set of one or more read voltages.

The controller 150 is configured to send data (e.g., the user data 106) and a write command to cause the non-volatile memory 130 to store the data to a specified address of the non-volatile memory 130. The data sent to the non-volatile memory 130 may include one or more ECC codewords based on the user data 106. The controller 150 is configured to send a read command to read data from a specified address of the non-volatile memory 130. As an example, the controller 150 may send a read command to sense threshold voltages stored at one of the wordlines 134-136, 144-146. The read circuitry 156 may perform a comparison to compare the sensed threshold voltages to read voltage levels (e.g., read thresholds). Based on the comparison, the read circuitry 156 may generate one or more ECC codewords. The ECC engine 152 may be configured to receive the one or more ECC codewords (e.g., upon a sense operation by the controller 150 to sense the one or more ECC codewords from the non-volatile memory 130) and to decode the one or more ECC codewords to generate the user data 106 (or a portion thereof).

The memory 160 of the controller 150 may include a single memory component or may correspond to multiple distinct memory components and/or multiple different types of memory components. For example, all or part of the memory 160 may correspond to a random access memory (RAM) or a high-speed cache. All or part of the memory 160 may correspond to another type of memory, such as a non-volatile memory included in the controller 150.

The memory 160 may include one or more tracking tables 162. The one or more tracking tables 162 may track one or more sets of read voltages associated with the non-volatile memory 130. For example, the tracking table(s) 162 may be configured to store one or more tags that each corresponds to a different set of one or more read voltages. The one or more tags may include a first tag 164 that is associated with a first set of read voltages and a second tag 166 that is associated with a second set of read voltages. The tracking table(s) 162 may also identify one or more blocks and/or wordlines of the non-volatile memory 130 that are associated with the one or more tags. For example, each of the one or more tags may correspond to one or more blocks and/or wordlines of the non-volatile memory 130. To illustrate, the first tag 164 may correspond to the first block 132 and the second tag 166 may correspond to the second block 142. Alternatively or additionally, the one or more tracking tables 162 may track errors detected by the ECC engine 152, such as read errors associated with one or more blocks of the non-volatile memory 130. Although the tracking table(s) 162 are illustrated as being included in the memory 160 of the controller 150, one or more of the tracking tables 162 may be stored and/or maintained in the non-volatile memory 130 or at another location, such as at a memory of the host device 180

A first graph 190 and a second graph 192 are provided to illustrate the first tag 164 that corresponds to the first block 132 and that is associated with the first set of read voltages, and to illustrate the second tag 166 that corresponds to the second block 142 and that is associated with the second set of read voltages. The first block 132 and the second block 142 may each include a MLC memory storing two bits per cell (e.g., each memory cell has four states, such as states "Er", "A", "B", and "C". The first graph 190 illustrates states of the first block 132 in a histogram showing a number of storage elements for each threshold voltage value. To illustrate, the states "Er", "A", "B", "C" of the first graph 190 are depicted relative to a first set of read voltages $v_1(t_1)$, $v_2(t_1)$, $v_3(t_1)$ that may be included in the first tag 164. The first set of read voltages $v_1(t_1)$, $v_3(t_1)$ may have been determined at a time $t_1$. Each of the states "Er", "A", "B", "C" has a corresponding voltage value range based on one or more of the first set of read voltages $v_1(t_1)$, $v_2(t_1)$, $v_3(t_1)$. For example, the state "Er" has a voltage value (corresponding to an all ones data value of "1 1") that is less than a read voltage $v_1(t_1)$. As another example, the state "A" has a voltage value (corresponding to a data value of "1 0") that is greater than or equal to a read voltage $v_1(t_1)$ and less than a read voltage $v_2(t_1)$.

The second graph 192 illustrates states of the second block 142 in a histogram showing a number of storage elements for each threshold voltage value. To illustrate, the states "Er", "A", "B", "C" of the second graph 192 are depicted relative to a second set of read voltages $v_1(t_n)$, $v_2(t_n)$, $v_3(t_n)$ that may be included in the second tag 166. The second set of read voltages $v_1(t_n)$, $v_2(t_n)$, $v_3(t_n)$ may have been determined at a time $t_n$. The first set of read voltages $v_1(t_1)$, $v_2(t_1)$, $v_3(t_1)$ may be a different set of voltages than the second set of read voltages $v_1(t_n)$, $v_2(t_n)$, $v_3(t_n)$.

The tag engine 158, such as a read voltage engine, may be configured to generate, update, and/or combine (e.g., merge) multiple tags associated with the tracking table(s) 162. The tag engine 158 may determine a particular tag (associated with a set of read voltages) for a particular block of the non-volatile memory 130. For example, when the particular block is opened for writing (or reading), the tag engine 158 may make a first attempt to write (or read) the particular block using an existing tag associated with the tracking table(s) 162. If the reading is successful, then the particular block is associated with the existing tag; otherwise, a new tag is generated (e.g., a new set of reading voltages may be generated using a direct cell voltage distribution (CVD) calculation). The new tag may be stored in the memory 160 and, when an additional block (that is unassigned to a corresponding tag) is opened subsequent to opening the particular block, a determination may be made whether the new tag is acceptable for the additional block. If the new tag is acceptable, the additional block may be associated with the new block and one or more of the tracking tables 162 may be updated. If the new tag is not acceptable for the additional block, an additional tag may be determined for the additional block.

As an illustrative example of generating a tag, the tag engine 158 may generate the first tag 164 corresponding to the first block 132. The first tag 164 may be associated with a set of one or more read voltages, such as the first set of read voltages $v_1(t_1)$, $v_2(t_1)$, $v_3(t_1)$. Each read voltage of the first set of read voltages $v_1(t_1)$, $v_2(t_1)$, $v_3(t_1)$ may be associated with a corresponding read voltage value. For example, $v_1(t_1)$ may be associated with a first read voltage, $v_2(t_1)$ may be associated with a second read voltage, and $v_3(t_1)$ may be associated with a third read voltage.

Additionally or alternatively, each read voltage of the first set of read voltages $v_1(t_1)$, $v_2(t_1)$, $v_3(t_1)$ may be associated with a corresponding range of read voltage values (e.g., a corresponding interval). For a particular tag, each range of read voltages may be determined such that any read voltage within the range of read voltages may be used to read a block associated with the particular tag. Each of the read voltages may be used to read the block such that a bit error rate (BER) of each of the read voltages is less than a threshold value (e.g., the threshold value sufficient so as not to impact a decoder throughput and to avoid use of too many soft bits, which waste time and energy). The range of read voltage values for a tag may be determined by performing one or more CVD calculations, performing one or more BER estimations, and/or extrapolating a range based on multiple CVD calculations, as illustrative, non-limiting examples.

As an illustrative example, the first tag 164 generated at a time $t_1$ may include the first read voltage $v_1(t_1)$ of the first set of read voltages $v_1(t_1)$, $v_2(t_1)$, $v_3(t_1)$. The first read voltage $v_1(t_1)$ may include a vector of one or more values, such as a particular read voltage value, a low range voltage value $v_1(t_1)_{low}$, a high range voltage value $v_1(t_1)_{high}$, a low offset voltage value $\Delta v_1(t_1)_{low}$ (e.g., a low offset of the particular read voltage value), a high offset voltage value $\Delta v_1(t_1)_{high}$ (e.g., a high offset of the particular read voltage value), a single offset voltage value $\Delta v_1(t_1)$ (e.g., selected as a smaller value of the low offset voltage value $\Delta v_1(t_1)_{low}$ and the high offset voltage value $\Delta v_1(t_1)_{high}$), or a combination thereof. As an illustrative, non-limiting example, the first read voltage $v_1(t_1)$ may be associated with a particular read voltage value of 1.0 volt, a low range voltage value $v_1(t_1)_{low}$ of 0.9 volts, and a high range voltage value $v_1(t_1)_{high}$ of 1.2 volts. Accordingly, based on the values of the particular read voltage value, the low range voltage value $v_1(t_1)_{low}$, and the high range voltage value $v_1(t_1)_{high}$, a low offset voltage value $\Delta v_1(t_1)_{low}$ is 0.1 volts and a high offset voltage value $\Delta v_1(t_1)_{high}$ is 0.2 volts.

As another illustrative example, the tag engine 158 (e.g., within the controller 150) may be configured to generate the first tag 164 associated with the first block 132 of the non-volatile memory 130. The first tag 164 may correspond to a first data set associated with a first set of read voltages $v_1(t_1)$, $v_2(t_1)$, $v_3(t_1)$. The first data set may indicate a first voltage range associated with a first read voltage of the first set of read voltages $v_1(t_1)$, $v_2(t_1)$, $v_3(t_1)$. The first voltage range may define an interval, such as a transition point between two adjacent states, of read voltages (e.g., acceptable read voltages) that may be applied to the first block 132. For example, the first voltage range may be defined by two data values. The tag engine 158 may further be configured to cause the first tag 164 to be stored at a memory, such as the memory 160 and/or the non-volatile memory 130.

The tag engine 158 (e.g., within the controller 150) may also be configured to generate the second tag 166 associated with the second block 142 of the non-volatile memory 130. The second tag 166 may correspond to a second data set associated with the second set of read voltages $v_1(t_n)$, $v_2(t_n)$, $v_3(t_n)$. The second data set may indicate a second voltage range associated with a second read voltage of the second set of read voltages $v_1(t_n)$, $v_2(t_n)$, $v_3(t_n)$. The tag engine 158 may further be configured to cause the second tag 166 to be stored at a memory, such as the memory 160 and/or the non-volatile memory 130. Each of the first read voltage of the first set of read voltages $v_1(t_1)$, $v_2(t_1)$, $v_3(t_1)$ and the second read voltage of the second set of read voltages $v_1(t_n)$, $v_2(t_n)$, $v_3(t_n)$ may be associated with a transition from a first state (e.g., a state "Er") to a second state (e.g., a state "A") that is adjacent to the first state.

The tag engine 158 may be configured to update one or more tags associated with the tracking table(s) 162. For example, the tag engine 158 may update a particular tag based on an indication and/or a determination that a number of errors associated with the particular tag and/or one or more blocks associated with the particular tag is greater than a threshold number of errors. To illustrate, the controller 150 (e.g., the tag engine 158) may be configured to initiate an update of the particular tag based on a determination that a number of errors associated with the particular tag exceeds the threshold number of errors.

The particular tag may be associated with a total number of "n" blocks (e.g., where "n" is an integer greater than zero). The tag engine 158 may select a sample of "m" blocks (e.g., where "m" is an integer greater than zero and less than or equal to n) from the "n" blocks. For each block of the "m" blocks, the tag engine 158 may select a set of "w" wordlines (e.g., where "w" is an integer greater than zero).

The tag engine 158 may then apply one or more direct CVD calculations to the "m" blocks. For example, using the set of "w" wordlines for each of the m blocks, the tag engine 158 may calculate a set of "w*m" (e.g., "w" multiplied by "m") voltage thresholds for each overlap region between two consecutive states. Based on the set of "w*m" threshold voltages, the tag engine 158 may compute a candidate tag including a candidate threshold voltage for each overlap region between two consecutive states. For example, the tag engine 158 may compute the candidate threshold for each overlap region between two consecutive states by selecting an average of the set of "w*m" voltage thresholds corresponding to a specific overlap region between two adjacent states. The tag engine 158 may estimate a bit error rate (BER) associated with the candidate tag by applying the candidate tag to each of the "w" wordlines of the "m" blocks which were used to calculate the candidate tag. If the BER satisfies (e.g., is less than or equal to) an error threshold, a set of candidate read voltage values of the candidate tag may be used to update the particular tag associated with the n blocks, such as replacing a set of read voltages of the particular tag with the set of candidate read voltages. If the BER does not satisfy the error threshold, the particular tag may remain unchanged or may be deleted. When the particular tag is deleted, a new tag is to be identified or generated for a corresponding block of the group of n blocks a next time the corresponding block is accessed (e.g., written to or read from).

As an illustrative example of updating a tag, the tag engine 158 (e.g., within the controller 150) may update the first tag 164. The first tag 164 may include a first data set associated with a set of read voltages (e.g., a set of reference voltages) to be applied to a plurality of blocks. The plurality of blocks may include the first block 132. The tag engine 158 may select one or more blocks of the plurality of blocks associated with the first tag 164. The one or more blocks of the plurality of blocks may include less than all of the plurality of blocks. For example, a predetermined number, such as a number corresponding to a particular percentage, of the plurality of blocks may be selected. The tag engine 158 may generate one or more data sets (e.g., one or more sets of threshold voltages) based on the one or more blocks. For example, the tag engine 158 may calculate a cell voltage distribution calculation on each of the one or more blocks to determine at least one data set for each of the one or more blocks. To illustrate, the tag engine 158 may select one or more wordlines from each of the one or more blocks. For example, a same number of wordlines may be selected from each of the one or more blocks. To illustrate, the one or more data sets may be generated based on the one or more wordlines by performing a CVD calculation on each of the one or more wordlines.

The tag engine 158 may calculate a second data set (e.g., a candidate data set) based on the one or more data sets. The second data set may be computed as an average of the one or more data sets that are based on the one or more wordlines. The tag engine 158 may test the second data set (e.g., the candidate data set) by initiating a read operation of each of the one or more blocks using the second data set, such as by reading each of the one or more wordlines using the second data set. For example, the tag engine 158 may determine a bit error rate (BER) estimation based on reading each of the one or more blocks using the second data set and may compare the BER estimation to a threshold value.

The tag engine 158 may update the first tag 164 based on the second data set, such as based on an outcome of a comparison of the BER estimation to the threshold value. The tag engine 158 may update the first tag 164 when the BER estimation satisfies (e.g., is less than) the threshold value. For example, when the BER estimation satisfies the threshold value, the first tag 164 may be replaced with the candidate tag (e.g., the first data set may be replaced with the second data set). When the BER estimation does not satisfy the threshold value, the tag engine 158 may update the first tag 164 by deleting the first tag 164.

The tag engine 158 may be configured to combine (e.g., merge) two or more tags associated with the tracking table(s) 162. For example, the tracking table(s) 162 may be configured to store a plurality of tags. The tag engine 158 may determine a number of tags stored in the tracking table(s) 162 and may compare the number of tags to a threshold number of tags. When the number of tags is greater than or equal to the threshold number of tags (e.g., a number of available tags to be stored is less than a predefined number), the tag engine 158 may trigger a process to combine two or more tags stored in the tracking table(s) 162 to reduce the number of tags stored in the tracking table(s) 162, thus increasing the number of available tags to be stored.

The process of combining two or more tags may include the tag engine 158 finding at least two tags which are close to each other according to some metric, as described in further detail below. A metric for determining the proximity of two tags may be associated with the difference of reading voltages of the two tags. The tag engine 158 may compute a candidate tag based on an operation applied to the at least two tags, such as a function (e.g., an average function or an intersection function) of the at least two tags. For example, a reading voltage of the candidate tag may be computed as an average of reading voltages of the at least two tags.

As part of the process of merging the at least two tags, the tag engine 158 may choose data sets (e.g., reference blocks) associated with each of the at least two tags and may choose a sample data set (e.g., one or more wordlines) from each of the data sets. To illustrate, for each tag of the at least two tags, the sample data sets may be determined by choosing a reference block from a set of blocks associated with a corresponding tag (of the at least two tags). A wordline may then be chosen from each of the reference blocks. By choosing a wordline from each of the reference blocks, an amount of data for testing the candidate tag may be acquired, where the amount of data is representative of each of the at least two tags which may be merged.

As part of the process, the tag engine 158 may test the candidate tag on each of the sample data sets. Testing the sample data sets may be done by performing a full decode on each of the sample data sets using the candidate tag for reading or by performing a BER estimation based on applying the candidate tag to the sample data sets. If the candidate tag is a valid tag for reading the sample data sets (e.g., the full decode produces less than a particular number of errors or the BER estimation is less than a threshold), then the at least two tags are merged into the candidate tag. Merging the at least two tags may include storing the candidate tag as a new tag and deleting the at least two tags. Alternatively, merging the at least two tags may include updating one of the at least two tags based on the candidate tag, such as updating a set of read voltages of the one tag with a candidate set of read voltages of the candidate tag, and deleting the tags that were not updated. The new candidate tag or the updated tag of the at least two tags may be associated with a plurality of blocks that were previously associated with the at least two tags prior to the merge. For example, the first tag 164 may include a first data set (e.g., a first set of one or more read voltages) that identifies a first voltage range associated with a first read voltage. Additionally, the second tag 166 may include a second data set (e.g., a second set of one or more read voltages) that identifies a second voltage range associated with a second read voltage.

To illustrate an example of the tag engine 158 determining whether at least two tags are close based on a metric, the tag engine 158 may evaluate combining the first tag 164 and the second tag 166. At a time $t_1$, the first set of read voltages $v_1(t_1)$, $v_2(t_1)$, $v_3(t_1)$ may be determined and a first vector $(v_1(t_1), v_2(t_1), v_3(t_1))$ of the first set of read voltages $v_1(t_1)$, $v_2(t_1)$, $v_3(t_1)$ may be added to a set of tags stored at the memory 160. The first vector $(v_1(t_1), v_2(t_1), v_3(t_1))$ may be stored as part of the first tag 164 (e.g., a tag $(t_1)$). One or more first blocks may be associated with the first tag 164, and each of the one or more first blocks may be read using the first set of read voltages $v_1(t_1)$, $v_2(t_1)$, $v_3(t_1)$. At a later time $t_n$, the second tag 166 including a second set of read voltages $v_1(t_n)$, $v_2(t_n)$, $v_3(t_n)$ may be determined and added to the set of tags as a second vector $(v_1(t_n), v_2(t_n), v_3(t_n))$.

The first tag 164 may be considered close to the second tag 166 if a norm of the difference between the first vector of the first set of read voltages $(v_1(t_1), v_2(t_1), v_3(t_1))$ and the second vector of the second set of read voltages $(v_1(t_n), v_2(t_n), v_3(t_n))$ is smaller than a predefined value (e.g., a threshold). Mathematically, the norm may be expressed as:

$$\|v_1(t_n)-v_1(t_1), v_2(t_n)-v_2(t_1), v_3(t_n)-v_3(t_1)\|.$$

For example, to determine whether all of the differences between different reading voltages of the first vector $(v_1(t_1), v_2(t_1), v_3(t_1))$ and the second vector $(v_1(t_n), v_2(t_n), v_3(t_n))$ are smaller than a predefined number, an $L_\infty$ norm may be used as a metric. The $L_\infty$ norm of a vector V, denoted as $\|V\|_\infty$, may be defined by the maximal absolute value of the elements of the vector V. Stated mathematically:

$$V = (v_1, v_2, \ldots, v_n) \to \|V\|_\infty = \max_{1 \le i \le n}\{|v_i|\}.$$

If all of the differences between different reading voltages of the first vector $(v_1(t_1), v_2(t_1), v_3(t_1))$ and the second vector $(v_1(t_n), v_2(t_n), v_3(t_n))$ are smaller than a predefined number, a candidate tag may be generated based on the first tag 164 and the second tag 166.

To illustrate the tag engine 158 finding two vectors with a small distance (e.g., a distance less than a threshold or a minimal distance), the tag engine 158 may search the plurality of tags for the two vectors which are nearest in $L_\infty$ norm. This may be expressed mathematically as:

$$\min_{i \ne j}\|V_i - V_j\|_\infty = \min_{i \ne j}(\max\{|v_1(t_i) - v_1(t_j)|, |v_2(t_i) - v_2(t_j)|, |v_3(t_i) - v_3(t_j)|\}).$$

The merged time tag may be the mean of the two vectors. In mathematical language:

$$\mathrm{merge}(V_i, V_j) = \mathrm{mean}(V_i, V_j) = \frac{(v_1(t_i) + v_1(t_j), v_2(t_i) + v_2(t_j), v_3(t_i) + v_3(t_j))}{2}$$

Optionally, the tags, i, j may be merged if $$\min_{i \ne j}\|V_i - V_j\|_\infty$$

is smaller man a pre-defined threshold. While all pairs of tags may be searched to find a particular pair having a minimal $L_\infty$ difference norm, such an approach may be time consuming. Alternatively, another approach may be to find a pair of tags, such that the $L_\infty$ norm of their difference is smaller than some threshold. Once the pair of tags is found, the pair of tags may be merged and/or a candidate tag may be calculated and tested against one or more blocks associated with the pair of tags.

Figure 3:
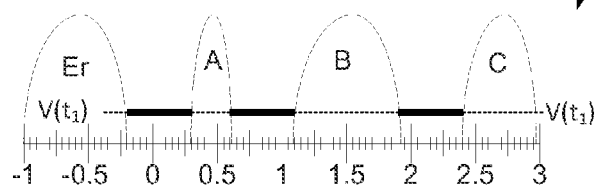
FIG. 3 is a second diagram illustrating an example of combining tags.
Figure 3:
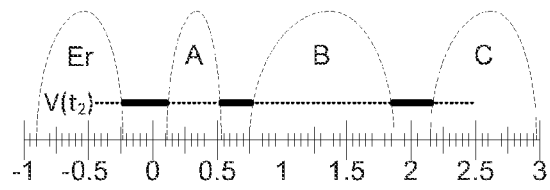
Figure 3:
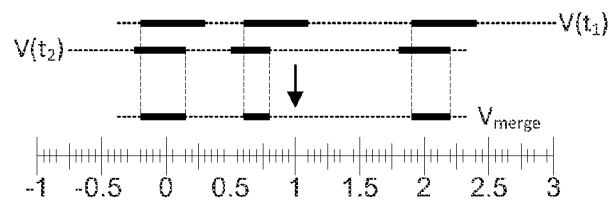

The tag engine 158 may be configured to merge at least two tags that each includes one or more read voltages associated with a corresponding voltage range, as described further with reference to FIG. 3. For example, the first tag 164 may include a first data set (e.g., a first set of one or more read voltages) that identifies a first voltage range associated with a first read voltage. Additionally, the second tag 166 may include a second data set (e.g., a second set of one or more read voltages) that identifies a second voltage range associated with a second read voltage. Each of the first read voltage and the second read voltage may correspond to a transition point between the same adjacent states. If the first voltage range and the second voltage range have an intersection that is non-empty (i.e., there is an overlap between the first voltage range and the second voltage range), the controller 150 may merge the first tag 164 and the second tag 166.

To merge the first tag 164 and the second tag 166, the tag engine 158 may be configured to combine the first tag 164 and the second tag 166 based on an operation, such as one or more arithmetic operations or a function. For example, the operation may include an intersection function. When the operation is the intersection function, the tag engine 158 may be configured to determine whether an intersection exists between the first voltage range and the second voltage range. Based on a determination that the intersection exists, the tag engine 158 may combine the first tag 164 and the second tag 166 to generate a third tag (e.g., a candidate tag). The third tag may correspond to a third data set (e.g., a third set of read voltages) that identifies a third voltage range that is associated with a third read voltage. For example, the third voltage range may be determined based on applying the intersection function to the first voltage range and the second voltage range. After the third tag is determined, the tag engine 158 may merge (e.g., consolidate) the first tag 164 and the second tag.

The tag engine 158 may be configured to merge the first tag 164 and the second tag 166 to generate a third read voltage (e.g., a particular voltage) based on the first read voltage associated with the first tag 164 and the second read voltage associated with the second tag 166. The tag engine 158 may calculate the third read voltage based on a median value of the third voltage range, based on the first voltage range and the second voltage range, or based on a mean of the first read voltage and the second read voltage, as illustrative, non-limiting embodiment. When the tag engine 158 calculates the third read voltage based on the mean of the first read voltage and the second read voltage, the tag engine 158 may determine whether the mean is included in the third voltage range. If the mean is included in the third voltage range, the tag engine 158 may store the mean as the third read voltage. If the mean in not included in the third voltage range, the tag engine 158 may set the third read voltage to one of a maximum value of the third voltage range or a minimum value of the third voltage range that is closest to the mean. Once the third read voltage is determined, the third read voltage and the third voltage range may be stored as a result of the first tag 164 and the second tag 166 being merged.

During operation of the data storage device 102, the data storage device 102 may receive data and/or commands from the host device 180. The data and/or commands may request the data storage device 102 to read data from or write data to one or more blocks of the non-volatile memory 130 of the data storage device. When the controller 150 identifies a block, such as the block 132, to be opened (e.g., a block that is not assigned to a corresponding tag), the controller 150 may try to attach the block to an existing tag stored in the tracking table(s) 162. If none of the existing tags are applicable (e.g., as determined by calculating a BER estimation for each of one or more of the existing tags and comparing the BER estimation to a threshold value), the controller 150 may generate a new tag, such as the first tag 164, to be assigned to the block.

When the new tag is added to the tracking table(s) 162, the controller 150 may determine whether an amount of free space for additional tags to be stored tracking tables is less than a threshold amount. The controller 150 may determine that the amount of free space is less than a threshold amount based on a comparison of a number of tags stored in the memory 160 to a threshold number. When the amount of free space is less than the threshold amount, the controller 150 may merge one or more tags to generate more free space. For example, the controller 150 may identify a pair of tags to be merged, such as the first tag 164 and the second tag 166. The controller 150 may generate a merged tag based on the first tag 164 and the second tag 166. The merged tag may be stored at the tracking table(s) in place of the first tag 164 and the second tag 166 thus creating more free space.

One or more of the tag management techniques described with reference to FIG. 1 may enable merging multiple tags, maintaining available space in a memory for additional time tags, while providing valid reading voltages for a large number of blocks. For example, by merging tags, updating tags, and generating tags, the data storage device may efficiently track and manage multiple tags. The tags may be stored in a small amount of memory while providing reading voltages for a large number of blocks.

Figure 2:
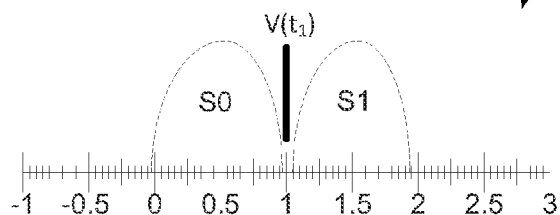
FIG. 2 is a first diagram illustrating an example of combining tags.
Figure 2:
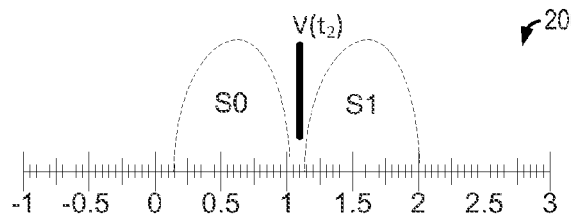

FIG. 2 is a diagram illustrating an example of combining tags. The example of combining tags may be performed by the data storage device 102 of FIG. 1. FIG. 2 depicts a first table 202, a first graph 204, a second graph 206, and a second table 208. The first table 202 may correspond to one of the tracking tables 162 of FIG. 1 prior to a merge operation and the second table 208 may correspond to the same table after performing the merge operation.

The first table 202 illustrates a tracking table prior to the merge operation performed by a tag engine, such as the tag engine 158 of FIG. 1. For example, the first table 202 may include or correspond to the tracking table(s) 162 of FIG. 1. The first table 202 may include a plurality of entries that each correspond to a tag. For example, the first table 202 may include a first tag $t_1$, a second tag $t_2$, a third tag $t_3$, and an nth tag $t_n$ (e.g., n may be any positive integer greater than one), as illustrative, non-limiting examples. Although the table 202 is illustrated as including four tags $t_1$, $t_2$, $t_3$, $t_n$, the table 202 may include less than four or more than four tags.

Each of the tags of the first table 202 may be associated with one or more blocks, such as one or more blocks of the non-volatile memory 130, and may be associated with a read voltage. For example, the first tag $t_1$ may be associated with blocks 1-10 and a first read voltage of 1.0 volt. The second tag $t_2$ may be associated with blocks 11-15 and a second read voltage of 1.1 volts. The third tag $t_3$ may be associated with blocks 16-40 and a third read voltage of 1.3 volts. The nth tag $t_n$ may be associated with blocks x-y (e.g., x and y may each be different positive integers greater than one) and a first read voltage of z volts. For a particular tag of the first table 202 having a corresponding read voltage and one or more corresponding blocks, the corresponding read voltage may be used to read each of the corresponding blocks.

Referring to the first graph 204 and the second graph 206, the first graph 204 corresponds to the first tag $t_1$ and the second graph 206 corresponds to the second tag $t_2$. The first graph 204 illustrates states of the blocks 1-10 associated with the first tag $t_1$ in a histogram showing a number of storage element for each threshold voltage value. The first graph 204 further illustrates the first read voltage at a transition between a first state S0 and a second state S1 that is adjacent to the first state S0. The second graph 206 illustrates states of the blocks 11-15 associated with the second tag $t_2$ in a histogram showing a number of storage elements for each threshold voltage value. The second graph 206 further illustrates the second read voltage at a transition between the first state S0 and the second state S1 that is adjacent to the first state S0.

Referring to the second table 208, the second table 208 illustrates the first table 202 after an update of the first table 202 based on the merge operation is performed on the first tag $t_1$ and the second tag $t_2$. The first tag $t_1$ and the second tag $t_2$ may have been merged by calculating a candidate read voltage on the first read voltage and the second read voltage. For example, the candidate read voltage may be calculated as an average of the first read voltage of 1.0 volt and the second read voltage of 1.1 volts. To generate the second table 208 from the first table 202, one of the first tag $t_1$ and the second tag $t_2$ may be updated based on the candidate read voltage and the other may be deleted. The tag to be updated based on the candidate read voltage may be selected as a tag that was generated first in time between the first tag $t_1$ and the second tag $t_2$, may be selected as a tag that corresponds to a greater number of blocks between the first tag $t_1$ and the second tag $t_2$, or may be selected randomly, as illustrative, non-limiting embodiments. For example, as illustrated in the second table 208, when the first tag $t_1$ is selected to be updated based on the candidate read voltage, such as based on having more associated blocks than the second tag $t_2$, the first read voltage may be updated to 1.05 volts and the blocks associated with the first tag $t_1$ may be updated to 1-15 (e.g., updated to include the blocks from the second tag $t_2$). As further illustrated in the second table 208, when the first tag $t_1$ is updated based on the candidate read voltage, the second tag $t_2$ may be deleted.

By merging the first tag $t_1$ and the second tag $t_2$, an available entry of a tag table (e.g., the second tag table 208) is created. When a predetermined amount of storage space is budgeted for tracking one or more tags, consolidating multiple tags into a single tag may enable a data storage device to continue to generate new tags as reading voltages associated with a non-volatile memory, such as the non-volatile memory 130 of FIG. 1, change over time.

FIG. 3 is a diagram illustrating an example of combining tags. The example of combining tags illustrated in FIG. 3 depicts a merging of tags that each includes a set of read voltages associated with corresponding read voltage ranges. The example of combining tags may be performed by the data storage device 102 of FIG. 1. FIG. 3 depicts a first table 302, a first graph 304, a second graph 306, a third graph 308, a second table 310, a third table 312, and a fourth table 314.

Multiple tags to be merged may be associated with an interval (e.g., voltage range) for each transition point between adjacent states. Each interval may be computed such that any read voltage within the interval may be used as a read voltage. For example, each voltage within an interval may be determined within an accepted maximal BER level (which may not impact decoder throughput) and without using numerous soft bits (which waist time and energy) to correct decoding errors.

Merging two tags that include one or more read voltage ranges may be performed whenever an intersection of each of two corresponding intervals within each of the two tags is non-empty. Any point in the intersection of the two corresponding intervals may be used as a read voltage for all of the blocks that are associated with the two tags. Accordingly, a merged tag based on the two tags may reliably be associated with blocks that were previously associated with each of the two tags without having to test the merged tag on the blocks of the two tags.

An illustrative tag (determined at a time t) that includes multiple intervals (e.g., voltages ranges) may include a set of reading voltages ($v_1(t)$, $v_2(t)$, $v_3(t)$) and an allowed interval associated with each of the reading voltages, such as three intervals that are defined around the three reading voltages. Accordingly, in vector notation, the set of reading voltages may be expressed as:

$$([v_1(t)-\Delta 1_{low}, v_1(t)+\Delta 1_{high}], [v_2(t)-\Delta 2_{low}, v_2(t)+\Delta 2_{high}], [v_3(t)-\Delta 3_{low}, v_3(t)+\Delta 3_{high}])$$

As depicted in the vector notation, a particular interval for a particular read voltage may be expresses using a corresponding lower boundary and a corresponding upper boundary. The lower boundary and upper boundary of each interval may be calculated, such that when reading a particular block with one of the lower boundary and the upper boundary as reading voltages, the BER remains in a predefined region (e.g., less than a threshold). In other words, if the particular block that is associated with the tag ($v_1(t)$, $v_2(t)$, $v_3(t)$) is read with a vector of reading voltages of the form ($w_1(t)$, $w_2(t)$, $w_3(t)$), where:

$$v_i(t)-\Delta i_{low} \le w_i(t) \le v_i(t)+\Delta i_{high}, \ i=1, 2, 3,$$

then the BER will not exceed a predefined level (e.g., a predefined threshold).

A tag that includes intervals for each of the read voltages may include three times or more information as compared to a tag that just includes read voltages, since in addition to each reading voltage, a lower and upper bound are stored as well. However, the additional information may allow for simpler and more efficient methods for merging time tags, as described further herein. Alternatively, a tag that includes intervals for each read voltage may include less than three times the information as compared to a tag that just includes read voltages. For example, the tag that includes the intervals may include the lower bound and the upper bound, but not the read voltage.

The first table 302 illustrates a tracking table prior to a merge operation performed by a tag engine, such as the tag engine 158 of FIG. 1. For example, the first table 302 may include or correspond to the tracking table(s) 162 of FIG. 1. The first table 302 may include a plurality of entries that each correspond to a tag. For example, the first table 302 may include a first entry (e.g., a first row) associated with a first tag $t_1$ and a second entry (e.g., a second row) associated with a second tag $t_2$. The first tag $t_1$ and the second tag $t_2$ may have a non-empty overlap (for each coordinate) and may be merged together by employing the maximal interval in the intersection, as described further herein.

The first entry and the second entry include a set of three read voltages (e.g., reference voltages) that are each associated with a corresponding range as identified by a low offset and a high offset of each read voltage. For example, the first entry may include a first read voltage $v_1(t_1)$ of 0.1 volts having a low offset $\Delta v_1(t_1)_{low}$ of 0.3 volts and a high offset $\Delta v_1(t_1)_{high}$ of 0.2 volts, a second read voltage $v_2(t_1)$ of 0.9 volts having a low offset $\Delta v_2(t_1)_{low}$ of 0.3 volts and a high offset $\Delta v_2(t_1)_{high}$ of 0.2 volts, and a third read voltage $v_3(t_1)$ of 2.2 volts having a low offset $\Delta v_3(t_1)_{low}$ of 0.3 volts and a high offset $\Delta v_3(t_1)_{high}$ of 0.2 volts. Accordingly, a first voltage range of the first read voltage $v_1(t_1)$ may range from −0.2 volts to 0.3 volts, a second voltage range of the second read voltage $v_2(t_1)$ may range from 0.6 volts to 1.1 volts, and a third voltage range of the third read voltage $v_3(t_1)$ may range from 1.9 volts to 2.4 volts.

As another example, the second entry may include a second read voltage $v_1(t_2)$ of 0.0 volts having a low offset $\Delta v_1(t_2)_{low}$ of 0.25 volts and a high offset $\Delta v_1(t_2)_{high}$ of 0.15 volts, a second read voltage $v_2(t_2)$ of 0.7 volts having a low offset $\Delta v_2(t_2)_{low}$ of 0.2 volts and a high offset $\Delta v_2(t_2)_{high}$ of 0.1 volts, and a third read voltage $v_3(t_2)$ of 2.0 volts having a low offset $\Delta v_3(t_2)_{low}$ of 0.2 volts and a high offset $\Delta v_3(t_2)_{high}$ of 0.2 volts. Accordingly, a first voltage range of the first read voltage $v_1(t_2)$ may range from −0.25 volts to 0.15 volts, a second voltage range of the second read voltage $v_2(t_2)$ may range from 0.5 volts to 0.8 volts, and a third voltage range of the third read voltage $v_3(t_2)$ may range from 1.8 volts to 2.2 volts.

Referring to the first graph 304 and the second graph 306, the first graph 304 relates to the first tag $t_1$ and the second graph 306 relates to the second tag $t_2$. The first graph 304 is a histogram of states associated with one or more blocks that correspond to the first tag $t_1$. The first graph 304 illustrates states of blocks associated with the first tag $t_1$ in a histogram showing a number of storage element for each threshold voltage value. The second graph 306 is a histogram of states associated with one or more blocks that correspond to the second tag $t_2$. The second graph 306 illustrates states of blocks associated with the second tag $t_2$ in a histogram showing a number of storage element for each threshold voltage value.

Referring to the third graph 308, a merging of the first tag $t_1$ and the second tag $t_2$ into a third tag (e.g., a $V_{merge}$ tag) is illustrated. The third graph 308 shows the merging of the regions:

$$[v_i(t_1)-\Delta i_{low}, v_i(t_1)+\Delta i_{high}] \cap [v_i(t_2)-\Delta i_{low}, v_i(t_2)+\Delta i_{high}]$$
for $i=1, 2, 3.$ The merged reading voltage corresponding to each of the intervals may be computed as an average of the reading voltages of individual tags that were merged together. If a particular average occurs outside of a corresponding merged interval, then a particular merged reading voltage may be determined to be a value of a nearest edge of the corresponding merged interval.

Referring to the second table 310, the second table 310 illustrates a third entry in a tracking table after the merge operation. For example, the second table 310 may include or correspond to the tracking table(s) 162 of FIG. 1. The third entry (generated at a time $t_3$) of the second table 310 may correspond to the $V_{merge}$ tag illustrated in the third graph and based on the first tag $t_1$ and the second tag $t_2$.

The third entry of the second table 310 may include a set of three read voltages that are each associated with a corresponding range as identified by a low offset and a high offset of each read voltage. For example, the third entry may include a first read voltage $v_1(t_3)$ of 0.5 volts having a low offset $\Delta v_1(t_3)_{low}$ of 0.25 volts and a high offset $\Delta v_1(t_3)_{high}$ of 0.1 volts, a second read voltage $v_2(t_3)$ of 0.8 volts having a low offset $\Delta v_2(t_3)_{low}$ of 0.2 volts and a high offset $\Delta v_2(t_3)_{high}$ of 0.0 volts, and a third read voltage $v_3(t_3)$ of 2.1 volts having a low offset $\Delta v_3(t_3)_{low}$ of 0.2 volts and a high offset $\Delta v_3(t_3)_{high}$ of 0.1 volts.

Referring to the third table 312, the third table 312 illustrates the third entry of the second table 310, after the third entry of the second table 310 is updated to remove the upper bound and the lower bound correspond to each of the first read voltage $v_1(t_3)$, the second read voltage $v_2(t_3)$, and the third read voltage $v_3(t_3)$ in a tracking table after the merge operation. Accordingly, the third entry as depicted in the third table 312 includes approximately two-thirds less information (e.g., data) as compared to the third entry of the second table 310.

Referring to the fourth table 314, the fourth table 314 illustrates the third entry of the second table 310 after the third entry of the second table 310 is updated to include a low range voltage value $v(t_3)_{low}$ and a high range voltage value $v(t_3)_{high}$ of the intervals of the third entry. The third entry of the fourth table 314 includes a first low range voltage value $v_1(t_3)_{low}$ of –0.2 volts and a first high range voltage value $v_1(t_3)_{high}$ of 0.15 volts for the first interval, a second low range voltage value $v_2(t_3)_{low}$ of 0.6 volts and a second high range voltage value $v_2(t_3)_{high}$ of 0.8 volts for the second interval, and a third low range voltage value $v_3(t_3)_{low}$ of 1.9 volts and a third high range voltage value $v_3(t_3)_{high}$ of 2.1 volts for the third interval. Accordingly, the third entry as depicted in the fourth table 314 includes approximately a third less information (e.g., data) as compared to the third entry of the second table 310. Using the third entry of the fourth table 314, a read voltage for a particular interval may be selected as a median value of the interval. For example, a first read voltage of the first read interval of the fourth table 314 may be associated with a value of –0.025 volts. As another example, a second read voltage of the second read interval of the fourth table 314 may be associated with a value of 0.7 volts.

When a data storage device, such as the data storage device 102 of FIG. 1, includes multiple tags and there is a need to combine (e.g., merge) tags that each include intervals, then a pair of tags to be merged together may be chosen. Various criteria for choosing the pair of tags from the multiple tags may be used. For example, an option for choosing the pair of tags to be merged may include searching for one or more pairs that each, when merged, results in a maximal $V_{merge}$ according to some metric. To illustrate, for each pair of tags of the multiple tags, a corresponding metric for evaluating a potential merging of the pair of tags may be a length of the minimal "intersecting" region. Accordingly, the criteria for a particular pair of tags to be merged may be a max min criteria (e.g., choose the pair of tags whose minimal "intersecting" region is maximal).

In mathematical language, this metric may be computed as described herein. For each tag t, associate a length vector L(t) to the tag t. For example, L(t)=($\Delta 1(t)_{high}$+1(t)$_{low}$,$\Delta 2(t)_{high}$+$\Delta 2(t)_{low}$,$\Delta 3(t)_{high}$ $\Delta 3(t)_{low}$), where L(t) is comprised of the lengths of the intervals around each transition point.

Compute the $L_\infty$ norm (length) of L(t).

When merging two tags, such as the first tag $t_1$ and the second tag $t_2$, the first tag $t_1$ may be expressed as $v(t_1)$= ([$v_{1,low}^{t1}$,$v_{1,high}^{t1}$],[$v_{2,low}^{t1}$,$v_{2,high}^{t1}$],[$v_{3,low}^{t1}$,$v_{3,high}^{t1}$]) and the second $t_2$ may be expressed as $v(t_2)$=([$v_{1,low}^{t2}$,$v_{1,high}^{t2}$], [$v_{2,low}^{t2}$,$v_{2,high}^{t2}$],[$v_{3,low}^{t2}$,$v_{3,high}^{t2}$]).

The merged tag can be written as:

$$v(t_1,t_2)=([v_{1,low}^{t1t2},v_{1,high}^{t1t2}], [v_{2,low}^{t1t2},v_{2,high}^{t1t2}],[v_{3,low}^{t1t2},v_{3,high}^{t1t2}]),$$

where $v_{i,low}^{t1t2}$=max($v_{i,low}^{t1}$,$v_{i,low}^{t2}$), and $v_{i,high}^{t1t2}$=min ($v_{i,high}^{t1}$,$v_{i,high}^{t2}$) for i=1, 2, 3.

The length vector of the merged tag can be written as:

$$L(t_1,t_2)=(v_{1,high}^{t1t2}-v_{1,low}^{t1t2},v_{2,high}^{t1t2}-v_{2,low}^{t1t2},v_{3,high}^{t1t2}-v_{3,low}^{t1t2})$$

The pair of tags to be chosen are the tags for which $\|L(t_1,t_2)\|_\infty$ is maximal. The $L_\infty$ norm is mentioned as an example and does not prohibit any other norm that may be used for evaluation of the merged time tags, such as the $L_1$ norm (defined by $L_1(v_1, v_2, \ldots, v_n)=\Sigma_{i=1}^{n}|v_i|$) or the Euclidean norm also known as the $L_2$ norm (defined by:

$$L_2(v_1, v_2, \ldots, v_n) = \sqrt{\sum_{i=1}^{n} |v_i|^2}.$$

Since there is no need to sense (e.g., test) and verify the merged tag (e.g., such as by determining a BER estimation based on the merged tag and comparing the BER estimation to a BER threshold or by performing a full decode using the merged tag to determine a number of read errors and comparing the number of read errors to an error threshold), the number of possible pairs of tags that can be checked to decide on the best pair of tags to merge can be large. For example, the possible pairs of tags may be checked at a controller, such as the controller 150 of FIG. 1, using a controller static random access memory (SRAM) of a high speed central processing unit (CPU). Accordingly, in a matter of a few micro seconds, a pair of tags to be merged can be found and updated which may improve read throughput of a system, such as a system included in the data storage device 102 of FIG. 1, where operating characteristics (e.g., read voltages) between blocks and memory dies of the system change over time.

By using tags that include intervals, merging of two tags may be performed to generate a merged tag. Because each of the intervals was generated according to an acceptable threshold (e.g., an error threshold), an intersection of multiple intervals also satisfies the same threshold. Accordingly, merging the two tags may be performed without having to test the merged tag with the blocks that were associated with the two tags, resulting in a time savings when merging blocks as compared to a merging process that tests a merged tag to determine whether the merged tag satisfies an error threshold.

Figure 4:
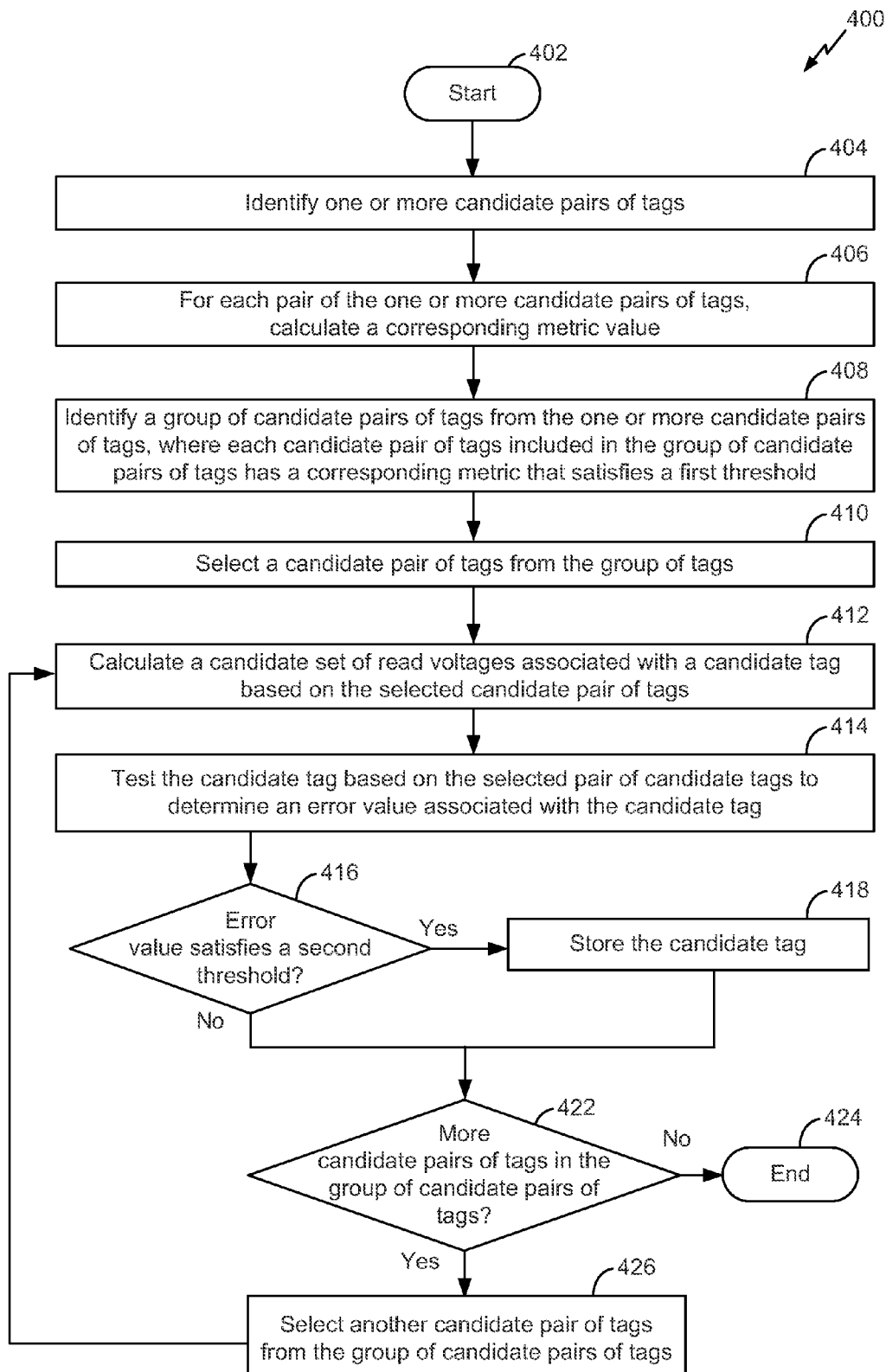
FIG. 4 is a flow diagram of a first illustrative method of operating a data storage device.

FIG. 4 illustrates a particular embodiment of a method 400 that may be performed at a data storage device, such as the data storage device 102 of FIG. 1. For example, the method 400 may be performed by the controller 150 and/or the tag engine 158 of FIG. 1. The method 400 may begin, at 402. To begin the method 400, a controller may initiate a consolidation routine (e.g., a merge routine), such as when a number of available tags is below a threshold number. For example, a memory, such as the memory 160 and/or the non-volatile memory 130 of FIG. 1, may be configured to store a plurality of tags. For example, the plurality of tags may include a first tag and a second tag. Each tag of the plurality of tags may include or corresponding to one or more blocks of a particular non-volatile memory and a set of one or more read voltages (e.g., reference voltages) that may be used to read each of the one or more blocks. The particular non-volatile memory, such as the non-volatile memory 130 of FIG. 1, may include a plurality of multi-level data storage elements. The first tag may be associated with a first set of read voltages to be applied to read a first set of the plurality of multi-level data storage elements. The second tag may be associated with a second set of read voltages to be applied to read a second set of the plurality of multi-level data storage elements.

The method 400 may include identifying one or more candidate pairs of tags, at 404. Responsive to initiation of the consolidation routine, the controller may search the plurality of tags to identify one or more candidate pairs of tags. For example, a first candidate pair may include the first tag and the second tag.

The method 400 may also include, for each pair of the one or more candidate pairs of tags, calculating a corresponding metric value, at 406. For example, the controller may determine one or more metric values. Each metric value of the one or more metric values may correspond to a different candidate pair of the one or more candidate pairs. As an illustrative example, a metric value the first candidate pair may be associated with a difference of a first reading voltage (e.g., a first set of reading voltages) of the first tag and a second reading voltage (e.g., a second set of reading voltages) of the second tag. To illustrate, the metric value may be a norm of the difference. As another illustrative example, the metric value of the first candidate pair may be associated with a norm of a vector based on an intersection of a first voltage range of the first tag and a second voltage range of the second tag.

The method 400 may further include identifying a group of candidate pairs of tags from the one or more candidate pairs of tags, where each candidate pair of tags included in the group of candidate pairs of tags has a corresponding metric that satisfies a first threshold, at 408. For example, the controller may select, based on the one or more metric values, a particular candidate pair of the one or more candidate pairs to be used to calculate the candidate tag. If none of the one or more candidate pairs of tags satisfies the first threshold, the consolidation routine may end.

The method 400 may also include selecting a candidate pair of tags from the group of tags, at 410. For example, the controller may select a particular candidate pair that includes the first tag and the second tag, such as the first tag 164 and the second tag 166 of FIG. 1.

The method 400 may further include calculating a candidate data set for a candidate tag based on the selected candidate pair of tags, at 412. For example, the controller may calculate the candidate set of read voltages for the candidate tag based on the first set of reading voltages of the first tag and based on the second set of reading voltages of the second tag. For example, the candidate set of read voltages for the candidate tag may be based on an average of the first set of reading voltages and the second set of reading voltages.

The method 400 may also include testing the candidate tag based on the selected pair of candidate tags to determine an error value associated with the candidate tag, at 414. The first tag may be associated with a first data set that includes one or more first blocks that may be read using the first set of reading voltages and the second tag may be associated with a second data set that includes one or more second blocks that may be read using the second set of reading voltages. The controller may select a first subset of the first data set, such as a first subset that includes one or more first wordlines of the one or more first blocks. The controller may also select a second subset of the second data set, such as a second subset that includes one or more second wordlines of the one or more second blocks. The controller may test the candidate tag (e.g., the candidate set of read voltages) on the first subset and the second subset to determine the error value associated with the candidate tag.

The method 400 may determine whether the error value satisfies a second threshold, at 416. When the error value is determined to not satisfy the second threshold, the method may advance to 422. When the error value is determined to satisfy the second threshold, the method 400 may store the candidate tag, at 418. The controller may store the candidate tag based on a determination that the candidate tag (e.g., the candidate set of read voltages) is valid for reading the first subset and for reading the second subset. For example, the controller may store the candidate tag at a tracking table, such as at one of the tracking tables 162 of FIG. 1. To store the candidate tag, the controller may update the first tag based on the candidate set of read voltages and update the one or more first blocks associated with the first tag to include the one or more second blocks associated with the second tag. Storing the candidate tag may cause the controller to remove the second tag from the plurality of tag because the second tag has been consolidated into the updated first tag. The controller may determine which of the first block and the second block is to be consolidated into the other block based on determining whether a first number of the one or more first blocks associated with the first tag is greater than a second number of the one or more second blocks associated with the second tag. If the first number is greater than the second number, the controller consolidates the second tag into the first tag. If the second number is greater than the first number, the controller consolidates the first tag into the second tag. If the first number and the second number are equal, the controller may select the tag that was most recently generated as the tag to be consolidated. After the candidate tag is stored, the method 400 may advance to 422.

The method 400 may determine whether more candidate pairs of tags are left in the group of candidate pairs of tags, at 422. When the group of candidate pairs of tags is determined to include more pairs of tags, the method may select another candidate pair of tags from the group of candidate pairs of tags, at 426, and advance to 412. The method 400 may continue to operate until an attempt has been made to consolidate all the candidate pairs of tags of the group of candidate pairs of tags. When the group of candidate pairs of tags is determined to include no more pairs of tags, the method ends, at 424.

By trying to merge each candidate pair of the group of candidate pairs that satisfies the first threshold, the data storage device may effectively combine multiple tags in an ordered fashion. Each of the combined tags may satisfy an error threshold and thus, each combined tag may maintain performance (e.g., a decoder throughput) of a data storage device.

Figure 5:
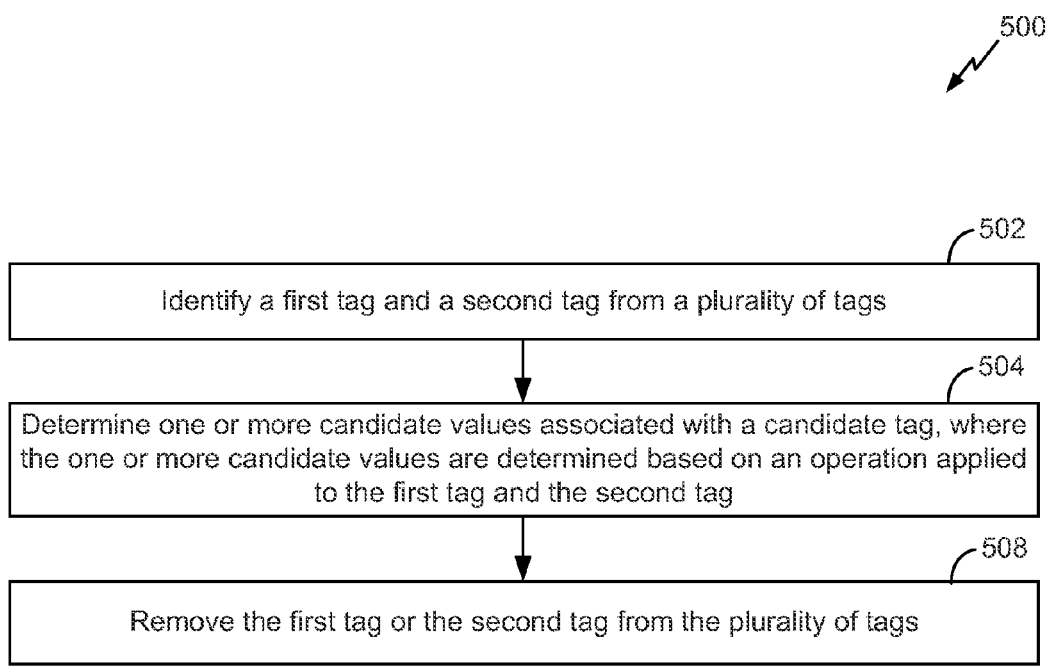
FIG. 5 is a flow diagram of a second illustrative method of operating a data storage device.

FIG. 5 illustrates a particular embodiment of a method 500 that may be performed at a data storage device, such as the data storage device 102 of FIG. 1. For example, the method 500 may be performed by the controller 150 and/or the tag engine 158 of FIG. 1.

The method 500 includes identifying a first tag and a second tag from a plurality of tags, at 502. For example, the first tag may include or correspond to the first tag 164 and the second tag may include or correspond to the second tag 166 of FIG. 1.

The method 500 also includes determining one or more candidate values associated with a candidate tag, where the one or more candidate values are determined based on as an operation applied to the first tag and the second tag, at 504. The operation may include one or more arithmetic computations or performance of a function, such as an average function and/or an intersection function. For example, the operation may be applied to the first tag and the second tag using a first set of one or more read voltages associated with the first tag and using a second set of one or more read voltages associated with the second tag. The one or more candidate values may include or correspond to a candidate set of one or more read voltages.

The method 500 further includes removing the first tag or the second tag from the plurality of tags, at 508. If the first tag is removed, the second tag may be updated based on the candidate tag. If the second tag is removed, the second tag may be updated based on the candidate tag. If the first tag and the second tag are removed, the candidate tag may be stored as a new tag in one or more tracking tables, such as the tracking tables 162 of FIG. 1, of the data storage device. The one or more tracking tables may be stored in a memory, such as a memory of the host device 180 coupled to the data storage device, the memory 160, and/or the non-volatile memory 130 of FIG. 1, as illustrative, non-limiting examples.

By calculating the candidate tag, the first tag and the second tag may be merged together to save space in a memory. For example, the candidate tag may be stored in a memory and the first tag and the second tag may be removed from the memory. Accordingly, rather than storing two tags (e.g., the first tag and the second tag), the memory stores one tag (e.g., the candidate tag). Alternatively, space may be saved at the memory by updating one of the first tag and the second tag based on the candidate tag, and removing the other tag that is not updated from the memory. Accordingly, rather than storing two tags (e.g., the first tag and the second tag), the memory stores one tag (e.g., an updated tag).

Figure 6:
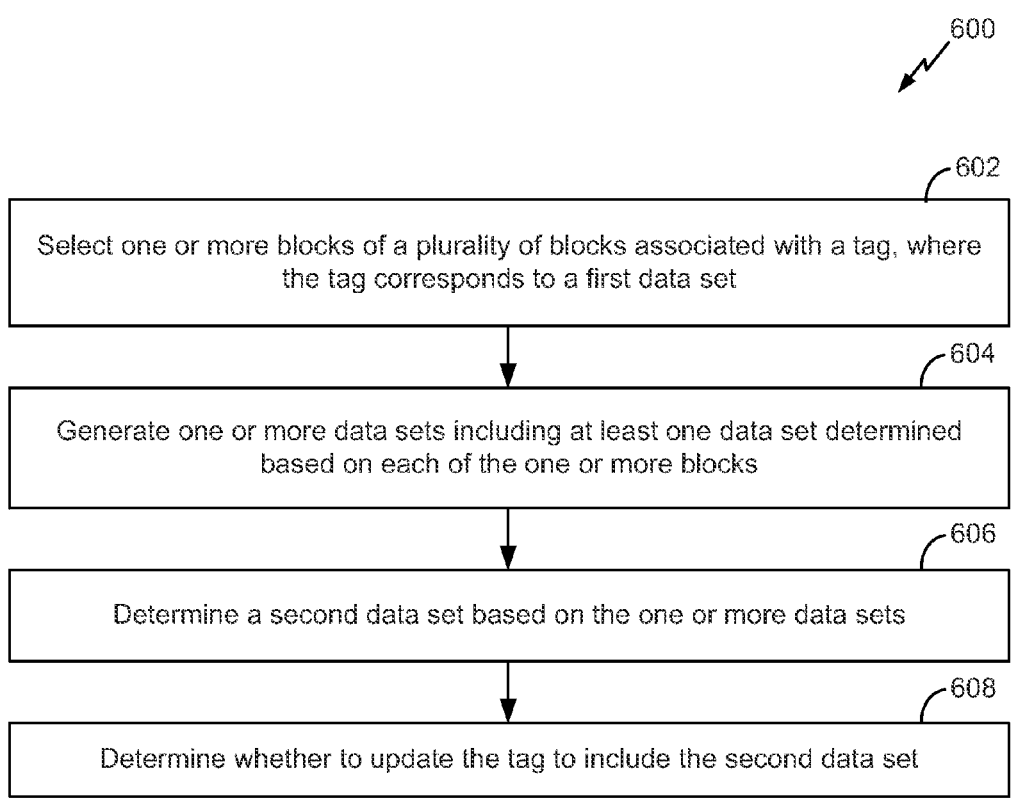
FIG. 6 is a flow diagram of a third illustrative method of operating a data storage device.

FIG. 6 illustrates a particular embodiment of a method 600 that may be performed at a data storage device, such as the data storage device 102 of FIG. 1. For example, the method 600 may be performed by the controller 150 and/or the tag engine 158 of FIG. 1.

The method 600 includes selecting one or more blocks of a plurality of blocks associated with a tag, where the tag corresponds to a first data set, at 602. The blocks may be included in a non-volatile memory, such as the non-volatile memory 130 of FIG. 1. To illustrate, the blocks may include the blocks 132, 142 of FIG. 1.

The method 600 also includes generating one or more data sets based on at least one data set determined for each of the one or more blocks, at 604. The one or more data sets may include one or more sets of read voltages. For example, for each of the one or more blocks, at least one corresponding data sets (e.g., at least one corresponding set of read voltages) may be generated.

The method 600 further includes determining a second data set based on the one or more data sets, at 606. The second data set may include a second set of read voltages that may be applied to read each of the plurality of blocks associated with the tag. The second data set may be calculated as an average of each of the one or more data sets.

The method 600 includes updating the tag to include the second data set, at 608. For example, the first data set of the tag may be replaced with the second data set. In a particular embodiment, the tag may be updated with the second data set after the second data set is tested on the one or more blocks.

By generating a second data set based on the one or more blocks associated with the tag, a potential update (based on the second data set) of the tag may be considered when use of the tag has resulted in an error rate and/or a number of errors that exceeds an error threshold. Updating the tag may enable the tag to remain associated with the plurality of blocks which may save time and processing resources as compared to deleting the tag and determining "new" tags for each of the plurality of blocks.

Figure 7:
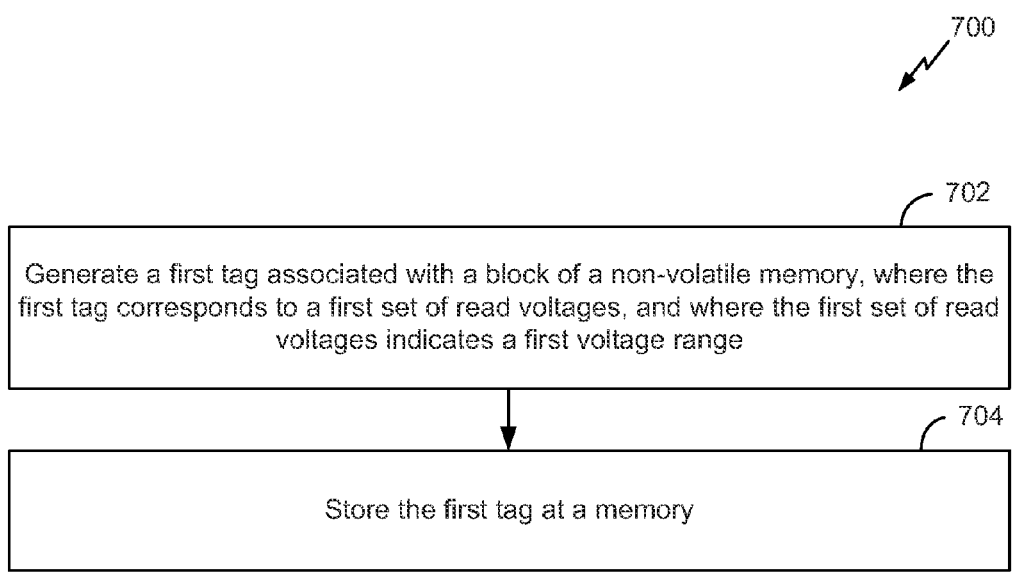
FIG. 7 is a flow diagram of a fourth illustrative method of operating a data storage device.

FIG. 7 illustrates a particular embodiment of a method 700 that may be performed at a data storage device, such as the data storage device 102 of FIG. 1. For example, the method 700 may be performed by the controller 150 and/or the tag engine 158 of FIG. 1.

The method 700 includes generating a first tag associated with a block of the non-volatile memory, where the first tag corresponds to a first set of read voltages, and where the first set of read voltages indicates a first voltage range, at 702. The first tag may include the first tag 164 or the second tag 166 of FIG. 1. The non-volatile memory may include or correspond to the non-volatile memory 130 of FIG. 1.

The method 700 also includes storing the first tag at a memory, at 704. The first tag may be stored in one or more tracking tables, such as the one or more tracking tables 162 of FIG. 1. The memory may include or correspond to a memory of the host device 180 coupled to the data storage device, the memory 160, and/or the non-volatile memory 130 of FIG. 1, as illustrative, non-limiting examples.

By generating one or more tags that each indicates a corresponding voltage range of acceptable read voltages (e.g., voltages that satisfy an error threshold), the controller 150 and/or the tag engine 158 of FIG. 1 may merge two tags based on a determination that an intersection of voltage ranges of the two tags is non-empty. A resulting merged tag may have a merged voltage range that corresponds to the intersection of the voltage ranges of the two tags. Because each of the corresponding voltage ranges includes voltages that satisfy an acceptable threshold (e.g., an error threshold), an intersection (e.g., the merged voltage range) of the corresponding voltage ranges also satisfies the same threshold. Accordingly, the merged voltage range does not have to be tested on blocks that were associated with the two tags to verify that the merged voltage range satisfies an error threshold.

The method 400 of FIG. 4, the method 500 of FIG. 5, the method 600 of FIG. 6, and/or the method 700 of FIG. 7 may be initiated or controlled by a field-programmable gate array (FPGA) device, an application-specific integrated circuit (ASIC), a processing unit, such as a central processing unit (CPU), a digital signal processor (DSP), a controller, another hardware device, a firmware device, or any combination thereof. As an example, the method 400 of FIG. 4, the method 500 of FIG. 5, the method 600 of FIG. 6, and/or the method 700 of FIG. 7 can be initiated or controlled by one or more processors included in or coupled to the data storage device 102 of FIG. 1.

A controller configured to perform the method 400 of FIG. 4, the method 500 of FIG. 5, the method 600 of FIG. 6, and/or the method 700 of FIG. 7, may be able to advantageously track and manage multiple tags that are each associated with a corresponding set of read voltages. Although various components of the data storage device 102 depicted herein are illustrated as block components and described in general terms, such components may include one or more microprocessors, state machines, or other circuits configured to enable the controller 150 and/or the tag engine 158 of FIG. 1 to perform operations described herein. One or more aspects of the controller 150 and/or the tag engine 158 may be implemented using a microprocessor or microcontroller programmed to perform operations described herein, such as one or more operations of the method 400 of FIG. 4, the method 500 of FIG. 5, the method 600 of FIG. 6, the method 700 of FIG. 7, or a combination thereof. In a particular embodiment, the controller 150 and/or the tag engine 158 includes a processor executing instructions that are stored at the non-volatile memory 130 and or the memory 160. Alternatively or in addition, executable instructions that are executed by the processor may be stored at a separate memory location that is not part of the non-volatile memory 130 and/or the memory 160, such as at a read-only memory (ROM).

The controller 150 and/or the tag engine 158 of FIG. 1 may be implemented using a microprocessor or microcontroller programmed to perform the method 400 of FIG. 4, the method 500 of FIG. 5, the method 600 of FIG. 6 and/or the method 700 of FIG. 7. For example, the microprocessor or microcontroller may be configured to execute instructions (e.g., a series of instructions, such as an algorithm) to perform certain operations described herein. In a particular embodiment, the controller 150 and/or the tag engine 158 (e.g., the microprocessor or microcontroller) includes a processor executing instructions that are stored at the non-volatile memory 130. Alternatively, or in addition, executable instructions that are executed by the processor may be stored at a separate memory location that is not part of the non-volatile memory 130, such as at a read-only memory (ROM).

In a first illustrative example, the processor may execute the instructions to identify a first tag and a second tag from a plurality of tags. The instructions to identify the first tag and the second tag may include instructions to read a table including the plurality of tags, instructions to create a pair of tags from the plurality of tags, instructions to calculate a metric value of the pair of tags, and/or instruction to select the pair of tags based on a comparison of the metric to a threshold value, as an illustrative, non-limiting example. The processor executes the instructions to determine one or more candidate values associated with a candidate tag. The one or more candidate values may be determined based on an operation applied to the first tag and the second tag. The instructions to determine the one or more candidate values may include instructions to determine a first read value of the first tag, instructions to determine a second read value of the second tag, instructions to calculate an average of the first read value and the second read value, instructions to generate the one or more candidate values based on the average, and/or instructions to set the one or more candidate values to the average, as an illustrative, non-limiting example. The processor may execute the instructions to store the candidate tag as one of the plurality of tags. The instructions to store the candidate tag may include instructions to write the candidate tag to a memory, as an illustrative, non-limiting example. The processor may execute the instructions to remove the first tag or the second tag from the plurality of tags. The instructions to remove the first tag or the second tag may include instructions to delete the first tag and/or instructions to delete the second, as an illustrative, non-limiting example.

In a second illustrative example, the processor may execute the instructions to select one or more blocks of a plurality of blocks associated with a tag. The tag may correspond to a first data set, such as one or more read voltages. The instructions to select the one or more blocks may include instructions for reading a table including the plurality of tags and/or instructions to identify the plurality of block, as an illustrative, non-limiting example. The processor may execute the instructions to generate one or more data sets based on at least one data set determined for each of the one or more blocks. The instructions to generate the one or more data sets may include instructions to select a wordline from each of the one or more blocks, instructions to perform a CVD calculation on each wordline, and/or instructions to store a result of each of the CVD calculations, as an illustrative, non-limiting example. The processor may execute the instructions to determine a second data set based on the one or more data sets. The instructions to determine the second data set may include instructions to access the one or more data sets, instructions to calculate an average based on the one or more data sets, and/or instructions to identify the average as the second data set, as an illustrative, non-limiting example. The processor may execute the instructions to update the tag to include the second data set. The instructions to update the tag may include instructions to write the second data set to a location of the first data set, as an illustrative, non-limiting example.

In a third illustrative example, the processor may execute the instructions to generate a first tag associated with a block of a non-volatile memory. The first tag may correspond to a first data set associated with a first set of read voltages. The first data set may indicate a first voltage range associated with a first read voltage of the first set of read voltages. The instructions to generate the first tag may include instructions to perform a CVD calculation on a block, instructions to calculate a read voltage of the block, instructions to calculate a voltage range of the read voltage, instructions to format the read voltage, and/or instructions to format the voltage, as illustrative, non-limiting examples. The processor may execute the instructions to store the first tag at a memory. The instructions to store the first tag may include instructions to write the first tag to a memory, as an illustrative, non-limiting example.

In a particular embodiment, the data storage device 102 may be attached to, or embedded within, one or more host devices, such as within a housing of a portable communication device. For example, the data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices. For example, the data storage device 102 may be a removable device such as a Universal Serial Bus (USB) flash drive or a removable memory card, as illustrative examples. In a particular embodiment, the non-volatile memory 130 includes a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. The illustrations are not intended to serve as a complete description of all of the elements and features of apparatus and systems that utilize the structures or methods described herein. Other embodiments may be utilized and derived from the disclosure, such that structural and logical substitutions and changes may be made without departing from the scope of the disclosure. Although specific embodiments have been illustrated and described herein, it should be appreciated that any subsequent arrangement capable of achieving the same or similar purpose or functionality may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. Accordingly, the disclosure and the figures are to be regarded as illustrative rather than restrictive.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory comprising a plurality of blocks associated with a tag, wherein the tag is associated with a first set of read voltages; and
a controller coupled to the non-volatile memory, wherein the controller is configured to generate one or more tags corresponding to one or more sets of read voltages associated with at least one other block of the non-volatile memory, wherein the controller is configured to select one or more blocks of the plurality of blocks and to generate one or more data sets based on the one or more blocks, wherein the controller is further configured to determine a second set of read voltages based on the one or more data sets and to determine whether to modify the tag to indicate the second set of read voltages.

2. The data storage device of claim 1, wherein the controller is further configured to initiate an update of the tag based on a determination that a number of errors associated with the tag exceeds a threshold, and wherein the one or more blocks of the plurality of blocks includes less than all of the plurality of blocks.

3. The data storage device of claim 1, wherein the one or more data sets includes multiple data sets, and wherein the controller is further configured to generate the second set of read voltages by performing an averaging operation on multiple sets of read voltages indicated by the multiple data sets.

4. The data storage device of claim 1, wherein the controller is further configured to perform a cell voltage distribution calculation on each of the one or more blocks to determine at least one data set for each of the one or more blocks, and wherein the controller is further configured to test the second set of read voltages by initiating a read operation of each of the one or more blocks using the second set of read voltages.

5. A device comprising:
a non-volatile memory configured to store one or more tags; and
a controller coupled to the non-volatile memory, wherein the controller is configured to generate a first tag associated with a block of the non-volatile memory, wherein the first tag corresponds to a first set of read voltages, wherein the first set of read voltages indicates a first voltage range, wherein the controller is further configured to cause the first tag to be stored in the non-volatile memory, and wherein the controller is further configured to combine the first tag and a second tag corresponding to a second set of read voltages based on an operation to generate a third tag corresponding to a third set of read voltages in response to a number of tags stored at the non-volatile memory being greater than a threshold.

6. The device of claim 5, wherein the first voltage range is defined by two data values.

7. The device of claim 5, wherein the controller is configured to search the one or more tags to identify one or more candidate pairs of tags, and wherein a first candidate pair of tags of the one or more candidate pairs of tags includes the first tag and the second tag.

8. The device of claim 7, wherein the controller is configured to determine one or more metric values, wherein each metric value of the one or more metric values corresponds to a different candidate pair of tags of one or more candidate pairs of tags, and wherein the controller is further configured to select, based on the one or more metric values, a particular candidate pair of tags of the one or more candidate pairs of tags to be merged during a merge routine.

9. The device of claim 8, wherein a metric value of the first candidate pair of tags is associated with a norm of a vector, and wherein the vector is based on an intersection of the first voltage range and a second voltage range indicated by the second set of read voltages.

10. The device of claim 5, wherein the controller is further configured to replace the first tag with the third tag and to remove the second tag.

11. The device of claim 5, wherein the operation includes one of an average function and an intersection function.

12. The device of claim 5, wherein the second tag is associated with a different block of the non-volatile memory.

13. A method comprising:
in a data storage device including a controller and a non-volatile memory, performing:
selecting one or more blocks of a plurality of blocks associated with a tag,
wherein the tag indicates a first set of read voltages;
determining one or more sets of read voltages including at least one set of read voltages determined based on each of the one or more blocks;
determining a second set of read voltages based on the one or more sets of read voltages; and
determining whether to modify the tag to indicate the second set of read voltages based on a comparison of a bit error rate (BER) estimation associated with the second set of read voltages to a threshold.

14. The method of claim 13, further comprising selecting one or more wordlines from the one or more blocks, wherein the one or more wordlines include at least one wordline selected from each of the one or more blocks, and wherein the one or more sets of read voltages is determined based on the one or more wordlines.

15. The method of claim 14, further comprising:
reading each of the one or more wordlines using the second set of read voltages;
determining the BER estimation based on reading each of the one or more blocks using the second set of read voltages; and
comparing the BER estimation to the threshold.

16. The method of claim 15, further comprising:
modifying the tag to indicate the second set of read voltages in response to determining that the BER estimation satisfies the threshold; or
deleting the tag in response to determining that the BER estimation fails to satisfy the threshold.

17. A method comprising:
in a device including a controller and a non-volatile memory, performing:
generating a first tag associated with a block of the non-volatile memory, wherein the first tag corresponds to a first set of read voltages, and wherein the first set of read voltages indicates a first voltage range;
storing the first tag in a memory, wherein the memory stores a second tag indicating a second voltage range; and
generating a third tag in response to identifying an intersection between the first voltage range and the second voltage range.

18. The method of claim 17, further comprising determining the first voltage range based on one or more cell voltage distribution (CVD) calculations performed on the block or based on one or more bit error rate (BER) estimations calculated for the block.

19. The method of claim 17, further comprising:
generating the second tag associated with a second block of the non-volatile memory, wherein the second tag corresponds to a second set of read voltages, and wherein the second set of read voltages indicates the second voltage range; and
storing the second tag in the memory.

20. The method of claim 19, further comprising:
identifying the intersection between the first voltage range and the second voltage range; and
combining the first tag and the second tag based on an operation to generate the third tag, wherein the third tag corresponds to a third set of read voltages that indicates a third voltage range.

21. The method of claim 17, wherein the second tag is associated with a different block of the non-volatile memory.

* * * * *